United States Patent [19]
Graeve et al.

[11] Patent Number: 6,014,764
[45] Date of Patent: Jan. 11, 2000

[54] PROVIDING TEST VECTORS WITH PATTERN CHAINING DEFINITION

[75] Inventors: Egbert Graeve, Los Altos; Burnell G. West, Fremont; Teck Chiau Chew, Cupertino, all of Calif.

[73] Assignee: Schlumberger Technologies Inc., San Jose, Calif.

[21] Appl. No.: 08/858,992

[22] Filed: May 20, 1997

[51] Int. Cl.$^7$ ................................................ G01R 31/28
[52] U.S. Cl. ............................................................ 714/738
[58] Field of Search ................................. 714/738, 742, 714/743, 744, 718, 724; 365/210

[56] References Cited

U.S. PATENT DOCUMENTS

| | | | |
|---|---|---|---|
| 4,502,127 | 2/1985 | Garcia et al. | 364/900 |
| 4,635,096 | 1/1987 | Morgan | 371/27.1 |
| 4,639,919 | 1/1987 | Chang et al. | 371/27.1 |
| 4,855,681 | 8/1989 | Millham | 371/27.1 |
| 5,122,988 | 6/1992 | Graeve | 365/219 |
| 5,151,903 | 9/1992 | Mydill et al. | 371/27 |
| 5,212,443 | 5/1993 | West et al. | 324/158 |
| 5,280,486 | 1/1994 | Arkin et al. | 371/22.6 |
| 5,561,765 | 10/1996 | Shaffer et al. | 395/183.18 |

FOREIGN PATENT DOCUMENTS

| | | | |
|---|---|---|---|
| 0 474 275 | 3/1992 | European Pat. Off. | G01R 31/318 |
| 0 699 999 | 3/1996 | European Pat. Off. | G06F 11/273 |
| 0 758 771 | 2/1997 | European Pat. Off. | G06F 11/273 |

OTHER PUBLICATIONS

Chang, Ed, Sep. 22, 1986, "Trillium Test Techniques," Trillium Test Systems Applications Notes, as presented to the 4th IC Test Conference, Beijing, China (Sponsored by The Chinese Institute of Electronics).

Huston, Robert, Dec. 17, 1985, "Pattern Architecture," Trillium Test Systems Applications Notes.

*Primary Examiner*—Hoa T. Nguyen
*Attorney, Agent, or Firm*—Fish & Richardson P.C.

[57] ABSTRACT

Apparatus and methods providing pattern chaining and looping in a circuit tester. The tester has a pattern data memory for storing multiple patterns and for storing a pattern chaining definition. Each pattern has pattern data for one or more test vectors. The pattern chaining definition specifies (i) a sequential order for the patterns and (ii) a location in the pattern data memory of each of the patterns. When the tester executes a functional test, the pattern chaining definition is read from the pattern data memory and used to locate each of the patterns, and the pattern data of each pattern is read to provide a test vector for each test period of the functional test. In another aspect, both a pattern program including one or more test vectors and a loop definition are stored in the pattern data memory. The pattern program defines an ordering for the test vectors, and the loop definition specifies a loop of test vectors. When the tester executes a functional test that includes the loop, the test vectors of the loop are read an indefinite number of times until a loop ending condition occurs. The first loop test vector of the loop need not be the initial test vector of the pattern program. In another aspect, the tester has chaining control registers including a start address register for pointing to a pattern chaining definition stored in the pattern data memory and a current pattern pointer register for pointing to a current pattern stored in the pattern data memory; a pattern data output sequencer; and a pattern data buffer memory coupled between the pattern data memory and the pattern data output sequencer.

48 Claims, 4 Drawing Sheets

| BIT 31 (loop tag) | BIT 30 (end tag) | BITS 29:0 |
|---|---|---|
| 0 | 0 | PBA1 |
| 0 | 0 | PEA1 |
| 0 | 0 | PBA2 |
| 0 | 0 | PEA2 |
| : | : | : |
| 1 | 0 | PBAi |
| 0 | 0 | PEAi |
| : | 0 | : |
| 0 | 0 | PBAj |
| 1 | 0 | PEAj |
| : | : | : |
| 0 | 0 | PBAn |
| 0 | 1 | PEAn |

PROVIDING TEST VECTORS WITH PATTERN CHAINING DEFINITION

BACKGROUND

The present invention relates to accessing pattern memory in automatic test equipment ("ATE") testers for testing electronic circuits, and more particularly to accessing pattern memory in systems using a processor-per-pin architecture. One such system is described in commonly-owned U.S. Pat. No. 5,212,443.

In a processor-per-pin architecture, a tester has local sequencers, each of which is programmable to provide events to a pin of a device under test (a "DUT"). In a system of this kind, each local sequencer generates events with reference to a global clock and other global signals. Characteristically, each local sequencer is individually programmable so that different sequencers can provide different events during the same test period. Characteristically, too, each local sequencer has a memory for storing events and a separate, local memory for storing test vectors.

Testers commonly provide 1 or 2 bits of pattern data for each pin in each vector, and one vector in each test period. A tester may provide test vectors having a depth of 4 bits or more. The actual data storage component of local memory is commonly a set of dynamic random access memory (DRAM) devices or synchronous DRAM devices, whose high average data rate is subject to interruption by required refresh cycles and setup times. It is therefore advantageous to provide pattern data from local memory through a FIFO (first-in, first-out) structure, such as the one described in commonly-owned U.S. Pat. No. 5,122,988, the disclosure of which is incorporated herein by this reference.

To accommodate the ever-increasing size and complexity of integrated circuit devices, automatic test equipment must achieve increasing flexibility of operation. The present invention is directed to apparatus and methods that increase the flexibility of methods by which pattern data may be accessed while a tester is running a functional test.

SUMMARY

In general, in one aspect, the invention features a method of providing test vectors in a tester for testing circuits. The method includes storing in a pattern data memory of the tester both a set of at least two patterns and a pattern chaining definition. Each pattern includes pattern data for one or more test vectors stored contiguously in the pattern data memory; and the pattern chaining definition specifies a sequential order for the patterns in the set and specifies a location in the pattern data memory of the contiguously-stored pattern data of each of the patterns in the set. Preferred embodiments of the invention include one or more of the following features. The pattern data memory includes a per-pin local memory associated with a pin of the tester in a processor-per-pin tester architecture, and the per-pin local memory operates to store that portion of the pattern data that is associated with the pin and to store the pattern chaining definition. The tester has a processor-per-pin tester architecture having a local sequencer per pin and substantially all local sequencers of the tester have a pattern data memory for storing test vectors. Patterns may be stored in non-adjacent locations in the pattern data memory. Every pattern in the set of patterns may be different from every other pattern in the set of patterns. The pattern chaining definition includes a list of pattern locations. Each pattern may begin and end at any test vector position in the pattern data memory. The pattern chaining definition specifies the location of a pattern by an address of a start of the pattern and an address of an end of the pattern. The start address and the end address are both bit addresses identifying a particular bit in a particular word of the pattern data memory. The pattern chaining definition specifies the location of a pattern by an address in the pattern data memory and a pattern length. The method also includes storing in the pattern data memory of the tester both a second set of at least two patterns and a second pattern chaining definition. In executing a functional test on the tester over an uninterrupted succession of test periods, each test period requiring a test vector, the method includes reading the pattern chaining definition from the pattern data memory; using the pattern chaining definition to identify the location in the pattern data memory of each of the patterns in sequence; and reading the patterns in sequence from the locations identified in the pattern chaining definition and reading the pattern data of each pattern to provide without interruption a test vector for each of the test periods in succession. The patterns may be stored in the pattern data memory in an order independent of the order in which the patterns are executed. The length of each test period may be 10 nanoseconds or less. Test vectors may have a depth of 1, 2, 4 or more bits. Operations reading patterns from the pattern data memory may be interspersed with operations reading the pattern chaining definition from the pattern data memory. The method also includes reading pattern data from the pattern data memory and then storing the pattern data in a buffer memory; and reading pattern data for each test vector from the buffer memory. The buffer memory may be a first-in first-out memory. Pattern data is read from the pattern data memory and stored in the buffer memory in units of pattern data words having a word size exceeding the bit depth of a test vector; and the method also includes extracting the pattern data for a test vector from a pattern data word for each of the test periods in succession. Extracting the first test vector in a pattern includes finding the pattern data for the first test vector within a first pattern data word on other than a pattern data word boundary. The tester has a processor-per-pin tester architecture having a local sequencer per pin and substantially all local sequencers of the tester have a pattern data memory for storing test vectors.

In general, in another aspect, the invention features a method of providing test vectors that includes storing in a pattern data memory of a tester both a pattern program and a loop definition. The pattern program includes a set of one or more test vectors stored in the pattern data memory, each test vector including pattern data for one test period for each of one or more pins of a device under test. The pattern program defines an ordering for the set of test vectors, and the loop definition specifies a loop of test vectors beginning with a first loop test vector in the set of test vectors and ending with a last loop test vector in the set of test vectors. Executing a functional test including the loop includes reading the test vectors in the pattern program, the reading operation reading from the first loop test vector through the last loop test vector an indefinite number of times until a loop ending condition occurs. Preferred embodiments of the invention include one or more of the following features. The pattern program is stored in contiguous locations in the pattern data memory. The first loop test vector of the loop need not be the initial test vector of the pattern program. The first test vector and the last test vector need not be stored on word boundaries in the pattern data memory. Reading the test vectors further includes reading pattern data from the pattern data memory and storing the read pattern data in a buffer memory; and reading pattern data out of the buffer memory to provide a test vector from the pattern data for each test period of the functional test. The size of the loop is greater than the size of the buffer memory. The pattern program includes a set of at least two patterns and a pattern chaining definition, wherein each pattern is one or more test vectors stored contiguously in the pattern data memory and the pattern chaining definition specifies a sequential order for the patterns in the set and specifies the location in the pattern data memory of each of the patterns in the set; and the loop of test vectors consists of one or more of the patterns in the set taken in the order specified by the pattern chaining definition. The first pattern of the loop is identified in the pattern chaining definition by a begin-loop flag; and the last pattern of the loop is identified in the pattern chaining definition by an end-loop flag.

In general, in another aspect, the invention features a method of rearranging the order in which patterns are executed in a functional test. The method includes storing in a pattern data memory of the tester both a set of at least two patterns and a pattern chaining definition, wherein each pattern includes or more test vectors stored contiguously in the pattern data memory, each test vector including pattern data for one test period for each of one more pins of a device under test, and wherein the pattern chaining definition specifies a sequential order for the patterns in the set; modifying the pattern chaining definition to specify a different sequential order for the patterns in the set; and reading the modified pattern chaining definition during execution of the functional test to determine the order in which patterns are read from the pattern data memory and used in the functional test.

In general, in another aspect, the invention features a method of modifying patterns executed in a functional test in a tester for testing circuits. The method includes storing in a pattern data memory of the tester both a set of at least two patterns and a pattern chaining definition, wherein each pattern includes one or more test vectors stored contiguously in the pattern data memory, each test vector including pattern data for one test period for each of one more pins of a device under test, and wherein the pattern chaining definition specifies the location in the pattern data memory of each of the patterns in the set; modifying the pattern chaining definition to specify a different location for a selected pattern in the set; and reading the modified pattern chaining definition during execution of the functional test to locate patterns used in the functional test. Preferred embodiments of the invention include one or more of the following features. The modification of the pattern chaining definition includes shortening the selected pattern by changing the specified location of the beginning of the selected pattern without moving the test vectors of the selected pattern in the pattern data memory. The modification of the pattern chaining definition includes shortening the selected pattern by changing the specified location of the end of the selected pattern without moving the test vectors of the selected pattern in the pattern data memory. The pattern chaining definition specifies a sequential order for the patterns in the set and specifies the location in the pattern data memory of each of the patterns in the set; and the modification of the pattern chaining definition includes creating a new pattern to replace the selected pattern by storing the new pattern in the pattern data memory and replacing the definition of the selected pattern in the pattern chaining definition with a new definition for the new pattern, the new definition specifying the place in the order of patterns of the new pattern and the location in the pattern data memory of the new pattern.

In general, in another aspect, the invention features an automatic test equipment circuit tester. The tester includes a pattern data memory operating to store test vectors and pattern chaining definitions and further operating to make available previously-stored test vectors and pattern chaining definitions; chaining control registers including a start address register for pointing to a pattern chaining definition stored in the pattern data memory, and a current pattern pointer register for pointing to a current pattern stored in the pattern data memory; a pattern data output sequencer; and a pattern data buffer memory coupled to receive and store pattern data read from the pattern data memory as pattern data is made available by the pattern data memory and connected a deliver pattern data as pattern data is required by the pattern data output sequencer. The pattern data output sequencer operates to provide a number of bits of pattern data defined by a vector bit depth for each test period during a running of a function test on the tester. Preferred embodiments of the invention include one or more of the following features. The current pattern pointer register is one of a pair of registers the contents of which define the beginning and ending of the current pattern. The tester further includes a current definition pointer register for pointing to a current entry in a pattern chaining definition. The buffer memory is a first-in first-out memory. The tester further includes a begin/end first-in first-out memory operating to identify the bit positions of pattern beginnings and endings in words of pattern data. The tester has a processor-per-pin architecture and the pattern data memory, the chaining control registers, the buffer memory, and the pattern data output sequencer are all components of a local sequencer associated with a pin of the tester. The tester further includes a last loop pattern definition pointer register for pointing to an entry in a pattern chaining definition corresponding to a beginning of a loop.

Among the advantages of the invention are one or more of the following. Chained patterns can be executed without a break between the end of one pattern and the beginning of the next pattern. Patterns can be edited by editing pattern begin and end addresses in a pattern list to the granularity of a single vector. Particular patterns may be used several times in a functional test without having to be duplicated in, or reloaded into, pattern data memory. A functional test may be repeated indefinitely—for example, for several minutes to make a diagnostic evaluation of an integrated circuit— without a break. A pattern or set of patterns of essentially unlimited length may be repeated. An essentially unlimited number of patterns may be chained together. Rearrangement of patterns and the addition or deletion of any pattern in a functional test may be done without reloading or moving the pattern data. A pattern for a functional test may be edited to delete as little as one vector without reloading or moving the pattern data. Particular patterns within a pattern list for a functional test may be edited to delete as little as one vector from either end of the pattern without reloading or moving the pattern data. A particular pattern may be divided into two patterns to delete as little as one vector without reloading or moving pattern data. In a tester having two test heads and a pattern data memory large enough to store test vectors for tests on both test heads, having both pattern data and pattern chaining definitions in the pattern data memory allows the tester to ping-pong between the test heads and run separate tests on them without having to reload a special pattern chaining memory. Having a pattern chaining definition and pattern data physically stored on a per-pin basis allows disjoint sets of pins to execute their patterns at distinct rates against distinct global test period clocks.

Other features and advantages of the invention will become apparent from the following description and from the claims.

DETAILED DESCRIPTION

Figure 1:
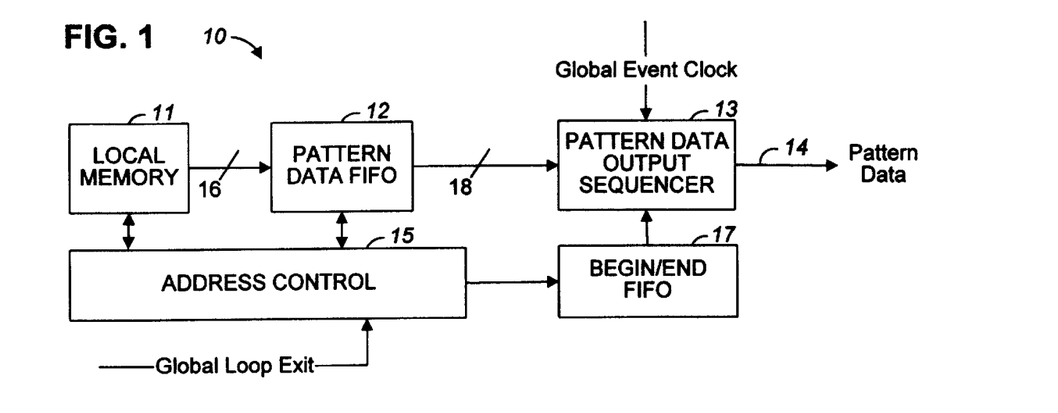
FIG. 1 is a block diagram of a portion of a test system local sequencer according to the present invention.

FIG. 1 is a block diagram of a portion of a test system local sequencer according to the present invention. The test system has a processor-per-pin architecture. The local sequencer has a local memory 11, including memory control, access control, and refresh circuitry as required, for storing test vector data (pattern data), and a pattern data FIFO memory 12 and its associated circuitry. The local memory and pattern data FIFO memory may be provided as described in U.S. Pat. No. 5,122,988. In operation, the local sequencer provides pattern data to a formatter that formats the pattern data and provides the pattern data to pin electronics for use in events of a test testing a device under test. Local memory 11 is typically large, providing, for example, 16 Mb, 32 Mb, or 64 Mb (megabit) 1-bit vectors in the form of 16-bit words from 1M×16 or 4M×16 synchronous DRAMs (SDRAMs). A tester operating mode defines a vector bit depth, which is a number of bits per pin per vector. Thus, the pattern data output 14 from the pattern data output sequencer 13 may be, for example, 1, 2, or 4 bits wide or wider, according to the vector bit depth.

In conventional operation, local memory 11 is accessed in a straight-line method. Before the start of a test, a start address register is loaded with the local memory address of the first bit of pattern data. When the test starts, address control 15 uses the address in the start address register to begin reading from the local memory and continues reading successive addresses until the end of the test using a local memory address counter. If the physical end of local memory 11 is reached during the test, a local memory address counter wraps to address zero.

Figure 2A:
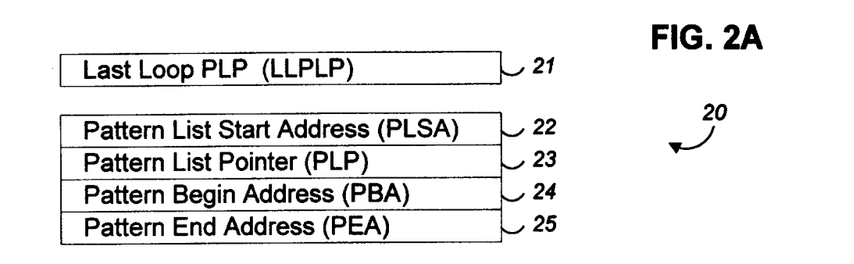
FIG. 2A is a block diagram illustrating a suite of registers used in a local sequencer according to the present invention.

Pattern chaining is a method of accessing local memory that allows discontiguous blocks of pattern data to be retrieved seamlessly from local memory. A block of pattern data in contiguous local memory locations will be called a "pattern". A "pattern chaining definition" for a set of patterns specifies the order in which the patterns in the set are to be read in a functional test and optionally a location in the pattern data memory of each of the patterns in the set. One form of pattern chaining definition is a pattern list. Pattern chaining and looping operations are supported by chaining control registers 20 (FIG. 2A) in the address control circuitry 15 (FIG. 1).

Figure 2B:
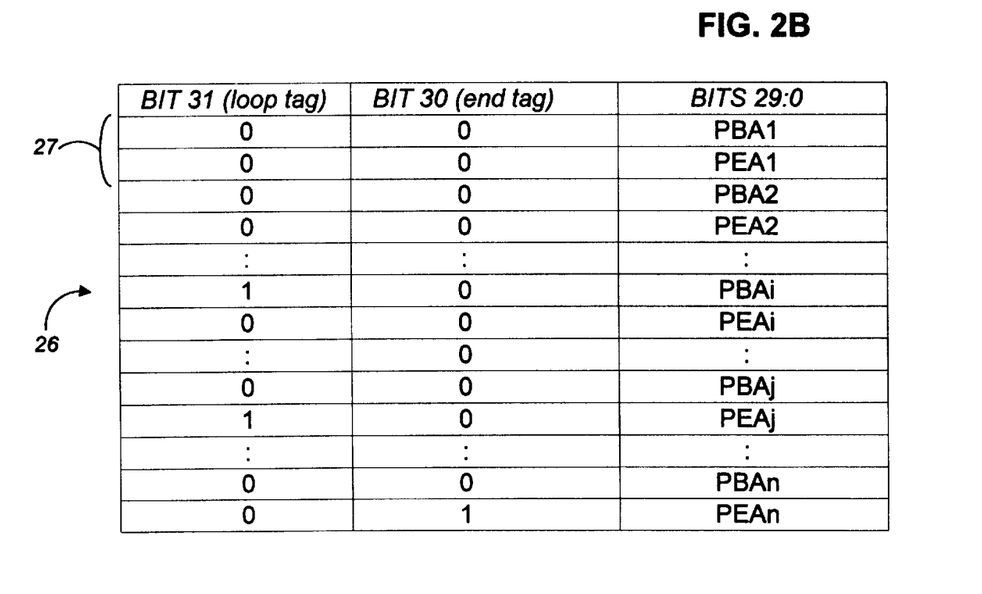
FIG. 2B is a block diagram illustrating a pattern list according to the present invention.

As shown in FIG. 2B, a pattern list 26 stored in local memory 11 (FIG. 1) is a list of one or more patterns each defined by two entries—for example, pair 27—defining the begin address and the end address of the pattern. If the pattern is one bit wide, the begin address and end address may be at any bit position; if the pattern is two bits wide, the least significant bit of the addresses must be zero; and addresses for wider patterns must be similarly aligned. In the illustrated pattern list 26, the list entries are 32 bits wide. Bits 29:0 hold a pattern begin address ($PBA_i$) or a pattern end address ($PEA_i$), each of which is an address in local memory. Storing the pattern list in local memory is advantageous in that it permits a pattern list of essentially any length to be stored and it allows pattern chaining and looping to be implemented with a minimum of additional circuitry.

Registers 22–25 (FIG. 2A) are among the registers used to implement pattern chaining and looping. A pattern list start address register (PLSA) 22 contains the address in local memory of the first entry in a pattern list. Successive pattern list entries reside at successive local memory locations. A pattern list pointer (PLP) register 23 contains the address in local memory of the pattern list entry of the next pattern to be executed. A pattern begin address (PBA) register 24 is a current pattern pointer register containing the address in local memory of the first data bit of the pattern currently being executed. A pattern end address (PEA) register 25 contains the address in local memory of the last data bit of the pattern currently being executed. Thus, patterns may begin and end at any bit position, without regard to local memory byte or word boundaries. With 30 bits available in a pattern begin or end address, a local memory one gigabit deep can be addressed.

Pattern chaining is enabled when PLSA register 22 is loaded. (Chaining is disabled when the conventional start address register is loaded.) When a test in chaining mode starts, address control 15 (FIG. 1) begins reading from local memory at the begin address ($PBA_i$) of the pattern referenced by PLSA register 22. When the end of one pattern is reached, data is fetched from the beginning of the next pattern in the list—for example, PBA2 after PEA1 in pattern list 26. Memory access continues in this manner until the pattern list pointer (PLP) register 23 reaches the last pattern end address entry in the pattern list.

Pattern looping allows the tester to loop over a designated one or more of the patterns in a pattern list. Each entry in a pattern list contains a tag bit that may be set to define loops. When the tag bit is set in a pattern begin address entry, it indicates that the pattern is the first in a loop. When set in a pattern end address entry, it indicates that the pattern is the last in a loop. Upon encountering a loop begin tag, address control 15 (FIG. 1) stores the pattern list pointer value for that patterns begin address entry in last loop pattern list pointer (LLPLP) register 21 and continues retrieving data from local memory. If a second loop begin is encountered, the second loop begin supersedes the first. (In an alternative embodiment, a register stack is provided, to permit multiple levels of looping.) When a loop end is encountered, the next data retrieved is from the loop begin pattern, a pattern list pointer to which is stored in the LLPLP register 21. Looping continues until a global loop exit signal is received, which returns address control to non-looping pattern chaining access. Upon receiving the global loop exit signal, address control delivers the remaining data from the current loop iteration, plus another loop iteration, before continuing with data from the first pattern (if any) following the loop in the pattern list.

Figure 3:
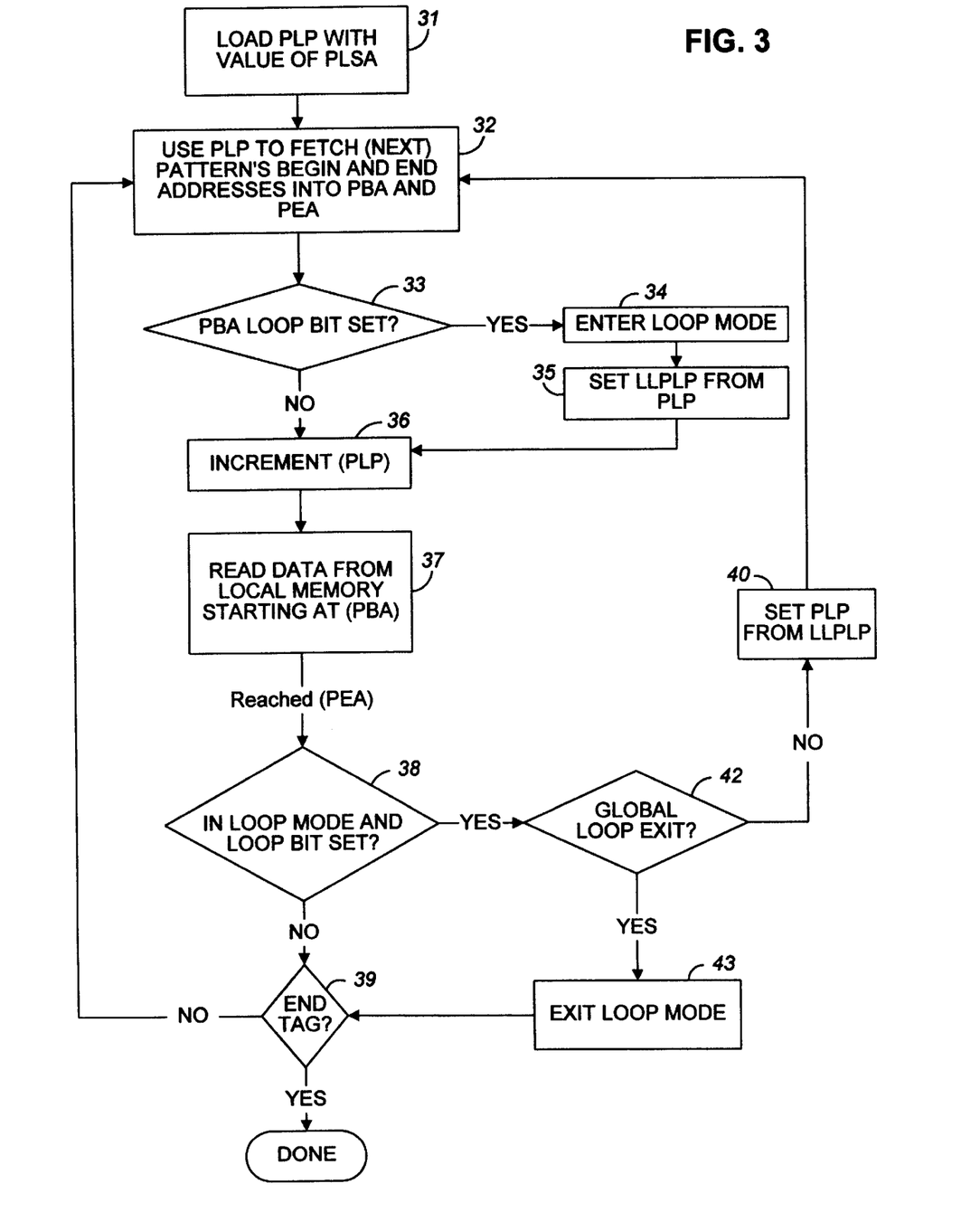
FIG. 3 is a flow chart of a method of chaining and looping patterns according to the present invention.

Referring to FIG. 3, when a functional test begins in pattern chain mode, the pattern list pointer (PLP) register is loaded with the value in the pattern list start address (PLSA) register (step 31). The PLP register is used to fetch the current pattern's begin address and end address from the pattern list and store them in the PBA register and the PEA register (step 32). If the pattern begin address entry in the pattern list has the loop tag bit set (shown in FIG. 2 as bit 31), the entry defines the top (beginning) pattern of a pattern loop. In this case (yes branch of step 33), address control enters loop mode (step 34) and stores the PLP corresponding to the loop-top entry in the last loop PLP (LLPLP) register. The PLP register is then incremented to point to the next pattern's begin address in the pattern list (step 36). Address control then uses the PBA register to fetch pattern data from the local memory (step 37) until the address in the PEA register is reached. Upon reaching the address in the PEA register, if it is not the end of a loop (no branch of step 38) and not the last pattern in the pattern list (no branch of step 39), address control fetches the next patterns' begin and end addresses through the PLP register (step 32) and then begins reading the next pattern's pattern data (step 37) as has been described.

This memory access process continues until address control encounters an end address whose end tag bit indicates that this is the last pattern in the pattern list (step 39). On encountering the end of the pattern list, address control stops reading local memory for pattern data while continuing to clock pattern data out of the pattern data FIFO memory 12 (FIG. 1) until the pattern data FIFO memory is empty. The memory access process may also be stopped by a global signal that ends the test.

When a subsequent test begins, the PLP register is again loaded with the value of the PLSA register and the process begins again from the beginning (step 31).

If address control is in loop mode (see yes branch of step 33) and address control encounters an end address whose loop tag bit is set (yes branch of step 38) and a global loop exit signal has not been received (no branch of step 42), the next pattern fetched is the loop-top pattern whose pattern list entry was stored in the LLPLP register, which is loaded into the PLP register (step 40). Address control fetches the loop-top pattern's begin and end addresses through the PLP register (step 32).

A global loop exit signal is given effect at the end of the pattern loop iteration during which it is received (step 42). The loop exit signal causes address control to exit loop mode (step 43). If the end of the pattern loop is also the end of the pattern list, the pattern list process is concluded. Otherwise, the process continues with the next pattern in the pattern list (step 32).

In reference again to FIG. 1, when local memory 11 includes devices such as DRAMs or SDRAMs for storing pattern data, the required pattern data output rate must be sustained even though such devices must take time periodically for housekeeping functions such as refreshes and row changes. The output rate that must be sustained is the product of the number of bits of pattern data that are to be provided to the formatter per event (i.e., the test vector bit depth) and the event rate of the tester. For example, if 4 pattern bits are provided for each event and the tester runs at 200 MHZ, the sustained pattern data output rate must be 800 Mb/S (megabits per second).

In one implementation of local memory 11, pattern data is stored in SDRAMs. The SDRAMs are operated with a burst length of two, so access always occurs in pairs, where the first word of the pair is at an even address. Access to successive words in a row proceeds quickly, but housekeeping has high time penalties. The penalties include the time required for a row change, which occurs whenever a next access to an SDRAM is in other than the currently active row and the time required for a refresh. A pattern change takes at most three row changes. One row change normally occurs from the end of a pattern to the next entry in the pattern list. A pattern list will start on a 16-bit boundary but need not start on a 32-bit boundary, so reading a pattern address pair may require reading as many as three bursts of two 16-bit words each. At most one row change may occur in this operation, and it may occur between any two of the three burst reads. The third row change may occur when the row referenced by the PBA register is activated.

The pattern data FIFO must be long enough that, when fall, it is able to continue supply pattern data without interruption in the event of a worst-case combination of row changes, pattern changes, and refreshes. For a sustained output data rate of 800 Mb/S, with SDRAMs that deliver two 16-bit words in a 20 ns (nanosecond) burst, a pattern data FIFO size of 42 words provides a margin of about 20% over worst-case requirements. To eliminate the possibility of some otherwise worst-case interactions between refreshes and row changes, address control inhibits refreshes within two reads of the end of a row. In addition, to accommodate the worst-case data delivery dropout from the SDRAM devices, refreshes are prohibited if the number of words in the pattern data FIFO plus the number of outstanding read access to the SDRAMs is less than the number of words the must be delivered from the pattern data FIFO during the worst-case dropout.

The dropout following a worst-case dropout will be due to a refresh, pattern change, or row change. The time at which the earliest pattern change may occur is determined by the minimum pattern length. The time at which the next refresh occurs is at a device-determined minimum time after the worst-case dropout. A row change occurs after a row of words has been fetched or as a result of a pattern change. The minimum pattern length must be chosen to allow the pattern data FIFO to refill before encountering the next situation producing a worst-case dropout. Because the worst-case dropout concludes with access beginning at the beginning of a row, when local memory is configured with 16 banks of SDRAMs having rows that are 256 bits long, no row change can occur before the next pattern change unless the pattern is longer than 4K bits (256 bits from a single row from each of 16 memory banks). To ensure that the pattern data FIFO contains enough words to handle the next worst-case situation (which may occur at the next refresh), the minimum pattern length is conservatively specified to be a few words longer than the pattern change penalty itself, so that for each minimum-length pattern read, the pattern data FIFO gains a few words until it is ultimately full again before the next refresh. Depending on whether 1, 2, or 4 bits are delivered for each event, the minimum pattern lengths are approximately 80, 176, and 512 bits with the tester running at 200 MHZ and using SDRAMs as described. The pattern length requirement does not apply to the first and last patterns of a pattern list unless they are in a pattern loop: the pattern data FIFO is preloaded before a test is started, and the last pattern of a pattern list is the last pattern of a test. Enforcement of the pattern length requirement may advantageously be left to test development software used to create and edit functional tests.

As a simple way to assure that multiple local sequencers execute pattern memory loops the same number of times without requiring that the global loop exit signal be synchronized with the operation of each local sequencer's address control, the length of a loop body is required to exceed the length of the pattern data FIFO. With a pattern data FIFO of forty 16-bit words, for example, the length of a loop body must be at least 640 bits. The delivery of pattern data 14 by the pattern data output sequencer 13 must be synchronous with the tester's global event clock, while the fetching of pattern data from the local memory 11 is advantageously done on a clock that need not be synchronous with the global event clock. In this context, the minimum loop body length requirement guarantees that not more than one iteration of a loop body is resident in the pattern data FIFO 12 at any one time, thereby allowing a global loop exit signal to terminate the same iteration across all the local sequencers of a tester without requiring synchrony with each local sequencer's address control. This allows loops to be defined without a predetermined or programmed number of iterations, so that all local sequencers of a tester can loop until a signal is detected on the device under test, for example. Enforcement of the loop body length requirement may advantageously be left to test development software used to create and edit functional tests.

The pattern data FIFO 12 provides a word of 18 bits to the pattern data output sequencer 13. Of these, 16 bits are the pattern data word received from local memory 11. The further two bits are a loop bit and a pattern end bit. The loop bit is set by address control 15 on each word that is part of a loop body; the pattern end bit is set at the end of a pattern list—it corresponds to bit 30 (end tag) on an entry in a pattern list (see FIG. 2B).

A begin/end FIFO 17 provides the information required by sequencer 13 to identify the bits in a word that begin or end a pattern, since a pattern may begin or end on any bit of a 16-bit word. This advantageously allows the pattern data FIFO to be filled with full words. The required size of a begin/end FIFO 17 depends on how many patterns can fit in the pattern data FIFO 12 at one time. The begin/end FIFO 17 is sized to hold a number of words equal to $$1 + 2 \cdot \left\lceil \frac{\text{pattern FIFO length in words}}{\text{minimum pattern length in words}} \right\rceil,$$

where [ . . . ] denotes the smallest integer not less than the enclosed quotient.

Figure 4:
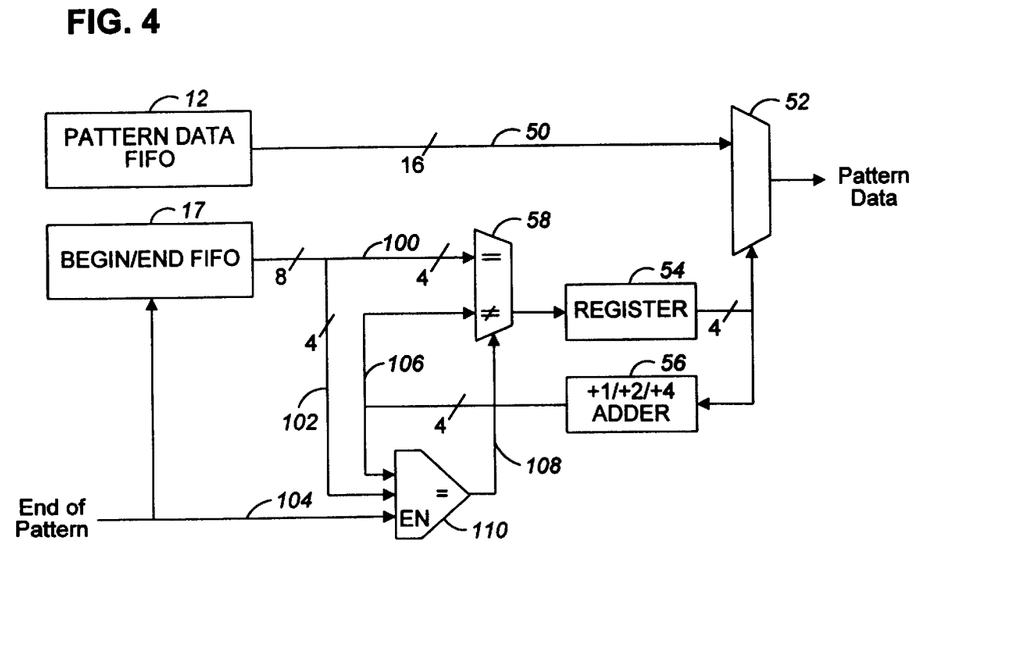
FIG. 4 is a block diagram of logic in a pattern data output sequencer in the test system local sequencer that finds pattern data bit boundaries.

FIG. 4 shows the logic using the begin/end FIFO 17 to start and end a pattern at the proper bit in a word of pattern data. Each entry in the begin/end FIFO stores a bit index pair—the low order 4 bits of the end address of a pattern (transmitted on signal lines 102) and the low order 4 bits of the start address of the successor pattern (transmitted on signal lines 100). The 18-bit output word of pattern data FIFO 12 includes 16 bits of pattern data (transmitted on signal lines 50) and an end of pattern bit (transmitted on signal line 104). The end of pattern bit is on when the output word contains a pattern boundary. For each test period, one, two, or four of the 16 bits of pattern data (transmitted on signal lines 50) are selected by multiplexer 52 according to the selection value presented to multiplexer 52 by register 54. The selected bit or bits are the pattern data for the test period. The number of bits selected for each period is determined by the operating mode of the tester, as described earlier. The test period is defined by an event clock signal TZ that is kept synchronized across local sequencers of the tester. In a tester supporting split timing, as disclosed in commonly-owned, copending U.S. patent application Ser. No. 08/790,141, a functional test may have two distinct event clock signals TZ, so that each of two disjoint sets of pins may execute events synchronized by its own distinct test period clock. Even with split timing, each local sequencer treats the clock signal TZ as a globally synchronized signal, and it will be so described in this specification.

At the beginning of a pattern, register 54 is initialized with the low order 4 bits of the start address of the pattern, which multiplexer 58 receives from begin/end FIFO 17 on signal lines 100. Having this value in register 54 will cause multiplexer 52 to select the proper first bits in the pattern from the 16-bit data word received from the pattern data FIFO 12. For each subsequent test period, the value in register 54 is incremented by one, two, or four (determined by the operating mode of the tester) by adder 56. The addition is modulo 16 because 16 bits are received from the pattern data FIFO. The resulting sum is stored in register 54 through multiplexer 58. Register 54 continues to be incremented as data is received from the pattern data FIFO until at the end of the pattern is reached. The end of pattern bit on line 104 signals the need to fetch an entry from the begin/end FIFO and enables comparator 110. Comparator 110 compares the low order 4 bits of the end address of the pattern (on signal lines 102) with the incremented (but not yet stored) value of register 54. When these are equal and comparator 110 is enabled, the comparator output on signal line 108 causes selector 58 to select the low order 4 bits of the start address of the successor pattern (received on signal lines 100), which causes the 4 start address bits to be loaded into register 54. This signal also causes pattern data FIFO 12 to provide a new data word to multiplexer 52.

Figure 5:
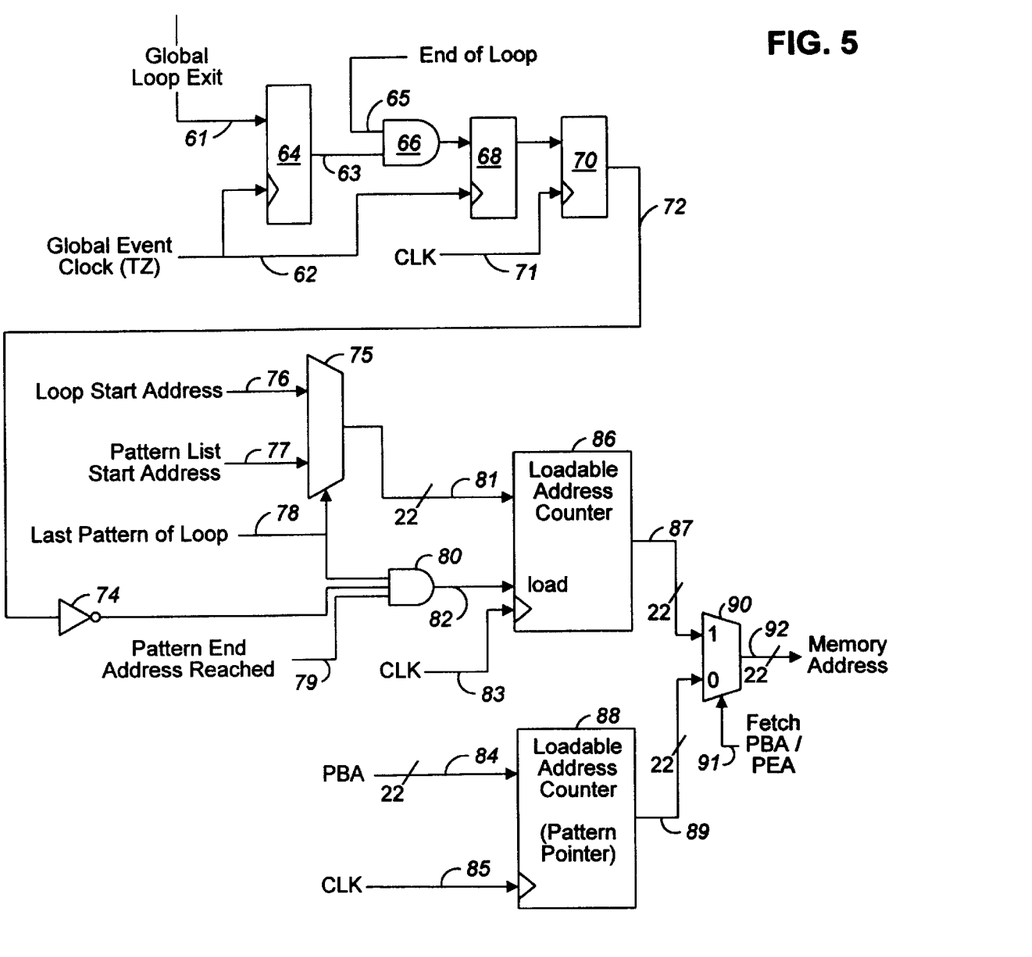
FIG. 5 is a block diagram of address control logic in the test system local sequencer that gives effect to loop tags and global loop exit signals.

FIG. 5 shows the address control logic that gives effect to loop tags in a pattern list and global loop exit signals. As described in reference to FIGS. 1, 2A, and 2B, last loop pattern list pointer (LLPLP) register 21 provides a loop start address, to which address the process returns when a loop end tag bit is encountered in a pattern end address. The loop start address is essentially a pointer into the pattern list pointing to the first pattern of the loop. The loop start address is transmitted on signal lines 76 to be loaded into a loadable address counter 86 through multiplexer 75. The output on signal lines 87 of address counter 86 is a pattern list pointer memory address used to address local memory for an entry in the current pattern list.

When a load signal is asserted on line 82, a pattern list pointer address is loaded into address counter 86. According to the selection signal given to multiplexer 75, the pattern list pointer loaded in address counter 86 is either a loop start address from signal line 76 or a pattern list start address from signal line 77. If the current pattern is the last pattern of a loop, a last pattern of loop signal is asserted on line 78 to cause multiplexer 75 to select the loop start address on line 76 to be loaded into address counter 86. Otherwise, at the end of a pattern, address counter 86 increments its stored value to generate the local memory address of the begin address of the next pattern in the current pattern list and increments again to generate the local memory address of the corresponding end address. Address counter 86 is clocked by the CLK signal received on signal line 83. Address counter 86 is enabled to increment on CLK when appropriate by enable signals (not shown).

The load signal on signal line 82 is generated as follows. When the pattern end address of the last pattern of a loop is read from PEA register 25 (FIG. 2A), the loop tag bit (bit 31) being set causes a last pattern of loop signal to be asserted on signal line 78. When the current memory address being read from the local memory is the same as the pattern end address in PEA register 25, a pattern end address reached signal is asserted on signal line 79. Normally the output of inverter 74 is on, so that reaching the last address of the last pattern of a loop normally causes a load signal to be asserted on signal line 82 as the output of AND gate 80, causing the address counter 86 to load the loop start address and begin reading the loop from the beginning again. This process is interrupted when a loop exit signal is asserted at the input to inverter 74, which signal causes the looping process to terminate because it prevents a load signal from being generated by gate 80, as a result of which the end of loop condition is ignored and the address counter 84 is not reloaded with a loop start address.

A second loadable address counter 88 provides pattern pointers, i.e., addresses that point to pattern data in the local memory. Normally, no fetch PBA/PEA signal is asserted on line 91, so the address on signal lines 92 is selected from address counter 88 and points to pattern data in the local memory. At the end of a pattern, a fetch PBA/PEA signal is asserted on line 91 and a pattern list pointer is selected from address counter 86 and used to read a pattern entry (begin and end addresses) from the local memory. The new pattern begin address (PBA) is transmitted on signal lines 84 to address counter 88, where it is incremented on the CLK signal, transmitted on signal line 85. Address counter 88 is enabled to increment on clock by appropriate enable signals (not shown).

When a global loop exit signal is asserted, it reaches address control circuitry on signal line 61, where it is latched in latch 64 by the test period marker signal TZ on signal line 62. The latched loop exit signal is provided on signal line 63 as an input to AND gate 66. The other input to gate 66 is an end of loop signal on signal line 65, which is asserted when the loop end bit is asserted in a word read from the pattern data FIFO 12. When both signals are asserted, gate 66 asserts a loop exit signal that is latched in latch 68 by the signal TZ. From latch 68 the loop exit signal is latched in latch 70 by the CLK signal on signal line 71. From latch 70 the loop exit signal is transmitted to the input of inverter 74 on signal line 72, where its presence blocks reloading of the loop stat address into address counter 86, as has been described. The two latches 68 and 70 are used to allow most of the address control and FIFO circuitry to operate on a local clock CLK that need not be synchronized to the test period clock TZ.

At AND gate 66, the end of loop signal on signal line 65 is asserted for all local sequencers at the same time because the local sequencers are synchronized by the global signal TZ. This ensures that each local sequencer looks at the global loop exit signal at the same time after fetching the same number iterations of the loop. For this reason, each local sequencer will exit the loop after executing the loop the same number of times.

Other embodiments are within the scope of the following claims. For example, the pattern list may be a simple list, as illustrated, or it may be a more complex data structure such as a linked list, a doubly linked list, or a list of pointers to patterns. In some embodiments, the pattern list may be stored in a separate memory. The functions of the pattern data FIFO and the begin/end FIFO may be combined in a single structure. The begin and end address pair defining a pattern may be replaced by an address-length pair. Instead of an end loop bit defining the end of a pattern loop, the length of the loop can be stored. Instead of a pattern list end bit defining the end of a pattern list, the length of the pattern list can be stored. The chaining control registers may be implemented as separate registers or as a larger memory structure storing the required data.

What is claimed is:

1. In a tester for testing circuits, a method of providing test vectors, comprising:

storing in a pattern data memory of the tester both a set of at least two patterns and a pattern chaining definition, wherein each pattern consists of pattern data for one or more test vectors stored contiguously in the pattern data memory; and the pattern chaining definition specifies a sequential order for the patterns in the set and specifies a location in the pattern data memory of the contiguously-stored pattern data of each of the patterns in the set.

2. The method of claim 1, wherein:

the pattern data memory comprises a per-pin local memory associated with a pin of the tester in a processor-per-pin tester architecture, and the per-pin local memory operates to store that portion of the pattern data that is associated with the pin and to store the pattern chaining definition.

3. The method of claim 1, wherein the tester has a processor-per-pin tester architecture having a local sequencer per pin and substantially all local sequencers of the tester have a pattern data memory for storing test vectors.

4. The method of claim 1, wherein at least two patterns are stored in non-adjacent locations in the pattern data memory.

5. The method of claim 1, wherein every pattern in the set of patterns is different from every other pattern in the set of patterns.

6. The method of claim 1, wherein the pattern chaining definition comprises a list of pattern locations.

7. The method of claim 1, wherein each pattern may begin and end at any test vector position in the pattern data memory.

8. The method of claim 1, wherein the pattern chaining definition specifies the location of a pattern by an address of a start of the pattern and an address of an end of the pattern.

9. The method of claim 8, wherein the start address and the end address are both bit addresses identifying a particular bit in a particular word of the pattern data memory.

10. The method of claim 1, wherein the pattern chaining definition specifies the location of a pattern by an address in the pattern data memory and a pattern length.

11. The method of claim 1, farther comprising:

storing in the pattern data memory of the tester both a second set of at least two patterns and a second pattern chaining definition, wherein each pattern in the second set consists of one or more test vectors stored contiguously in the pattern data memory; and the second pattern chaining definition specifies a sequential order for the patterns in the second set and specifies the location in the pattern data memory of each of the patterns in the second set.

12. The method of claim 1, further comprising:

executing a functional test on the tester, the functional test operating over an uninterrupted succession of test periods and requiring a test vector for each of the test periods in succession, wherein executing the functional test includes:

reading the pattern chaining definition from the pattern data memory;

using the pattern chaining definition to identify the location in the pattern data memory of each of the patterns in sequence; and reading the patterns in sequence from the locations identified in the pattern chaining definition and reading the pattern data of each pattern to provide without interruption a test vector for each of the test periods in succession.

13. The method of claim 12, wherein the patterns are stored in the pattern data memory in an order independent of the order in which the patterns are executed.

14. The method of claim 12, wherein the length of each test period is 10 ns or less.

15. The method of claim 12, wherein all test vectors have a depth of 1 bit.

16. The method of claim 12, wherein all test vectors have a depth of 2 bits.

17. The method of claim 12, wherein all test vectors have a depth of 4 or more bits.

18. The method of claim 12, wherein operations reading patterns from the pattern data memory are interspersed with operations reading the pattern chaining definition from the pattern data memory.

19. The method of claim 12, wherein reading patterns and providing a test vector further comprises:
reading pattern data from the pattern data memory and then storing the pattern data in a buffer memory; and
reading pattern data for each test vector from the buffer memory.

20. The method of claim 19, wherein the buffer memory is a first-in first-out memory.

21. The method of claim 19, wherein:
pattern data is read from the pattern data memory and stored in the buffer memory in units of pattern data words having a word size exceeding the bit depth of a test vector; and
the method further comprises extracting the pattern data for a test vector from a pattern data word for each of the test periods in succession.

22. The method of claim 21, wherein extracting the first test vector in a pattern includes finding the pattern data for the first test vector within a first pattern data word on other than a pattern data word boundary.

23. The method of claim 1, wherein the tester has a processor-per-pin tester architecture having a local sequencer per pin and substantially all local sequencers of the tester have a pattern data memory for storing test vectors.

24. In a tester for testing circuits, a method of providing test vectors, comprising:
storing in a pattern data memory of the tester both a pattern program and a loop definition, wherein the pattern program comprises a set of one or more test vectors stored in the pattern data memory, each test vector comprising pattern data for one test period for each of one or more pins of a device under test, and wherein the pattern program defines an ordering for the set of test vectors, and the loop definition specifies a loop of test vectors beginning with a first loop test vector in the set of test vectors and ending with a last loop test vector in the set of test vectors; and
executing a functional test including the loop by reading the test vectors in the pattern program, the reading operation reading from the first loop test vector through the last loop test vector an indefinite number of times until a loop ending condition occurs.

25. The method of claim 24, wherein the pattern program is stored in contiguous locations in the pattern data memory.

26. The method of claim 24, wherein the first loop test vector of the loop is not the initial test vector of the pattern program.

27. The method of claim 24, wherein the first test vector and the last test vector are not stored on word boundaries in the pattern data memory.

28. The method of claim 24, wherein reading the test vectors further comprises:
reading pattern data from the pattern data memory and storing the read pattern data in a buffer memory; and
reading pattern data out of the buffer memory to provide a test vector from the pattern data for each test period of the functional test.

29. The method of claim 28, wherein the size of the loop is greater than the size of the buffer memory.

30. The method of claim 24, wherein:
the pattern program comprises a set of at least two patterns and a pattern chaining definition, wherein each pattern consists of one or more test vectors stored contiguously in the pattern data memory and the pattern chaining definition specifies a sequential order for the patterns in the set and specifies the location in the pattern data memory of each of the patterns in the set; and
the loop of test vectors consists of one or more of the patterns in the set taken in the order specified by the pattern chaining definition.

31. The method of claim 30, wherein:
the first pattern of the loop is identified in the pattern chaining definition by a begin-loop flag; and
the last pattern of the loop is identified in the pattern chaining definition by an end-loop flag.

32. A method of rearranging the order in which patterns are executed in a functional test, comprising:
storing in a pattern data memory of the tester both a set of at least two patterns and a pattern chaining definition, wherein each pattern comprises one or more test vectors stored contiguously in the pattern data memory, each test vector comprising pattern data for one test period for each of one more pins of a device under test, and wherein the pattern chaining definition specifies a sequential order for the patterns in the set;
modifying the pattern chaining definition to specify a different sequential order for the patterns in the set; and
reading the modified pattern chaining definition during execution of the functional test to determine the order in which patterns are read from the pattern data memory and used in the functional test.

33. A method of modifying patterns executed in a functional test in a tester for testing circuits, comprising:
storing in a pattern data memory of the tester both a set of at least two patterns and a pattern chaining definition, wherein each pattern comprises one or more test vectors stored contiguously in the pattern data memory, each test vector comprising pattern data for one test period for each of one more pins of a device under test, and wherein the pattern chaining definition specifies the location in the pattern data memory of each of the patterns in the set;
modifying the pattern chaining definition to specify a different location for a selected pattern in the set; and
reading the modified pattern chaining definition during execution of the functional test to locate patterns used in the functional test.

34. The method of claim 33, wherein the modification of the pattern chaining definition comprises shortening the selected pattern by changing the specified location of the beginning of the selected pattern without moving the test vectors of the selected pattern in the pattern data memory.

35. The method of claim 33, wherein the modification of the pattern chaining definition comprises shortening the selected pattern by changing the specified location of the end of the selected pattern without moving the test vectors of the selected pattern in the pattern data memory.

36. The method of claim 33, wherein:
the pattern chaining definition specifies a sequential order for the patterns in the set and specifies the location in the pattern data memory of each of the patterns in the set; and the modification of the pattern chaining definition comprises creating a new pattern to replace the selected pattern by storing the new pattern in the pattern data memory and replacing the definition of the selected pattern in the pattern chaining definition with a new definition for the new pattern, the new definition specifying the place in the order of patterns of the new pattern and the location in the pattern data memory of the new pattern.

37. An automatic test equipment circuit tester, comprising:

a pattern data memory operable to store test vectors and pattern chaining definitions and further operable to make the test vectors and pattern chaining definitions available for reading;

address control circuitry operable to read test vector pattern data from the pattern data memory, the address control circuitry including chaining control registers operable to define which pattern data is to be read from the pattern data memory, the chaining control registers comprising a start address register for pointing to a pattern chaining definition stored in the pattern data memory, and a current pattern pointer register for pointing to a current pattern stored in the pattern data memory;

a pattern data buffer memory coupled to the pattern data memory to receive test vector pattern data read from the pattern data memory by the address control circuitry, the pattern data buffer memory being operable to store test vector pattern data as the test vector pattern data is made available by the pattern data memory; and a pattern data output sequencer coupled to receive pattern data from the pattern data buffer memory and operable to provide a number of bits of pattern data for each test period during a running of a function test on the tester, the number of bits being defined by a vector bit depth.

38. The tester of claim 37, wherein:

the current pattern pointer register is one of a pair of registers the contents of which define the beginning and ending of the current pattern.

39. The tester of claim 37, further comprising:

a current definition pointer register for pointing to a current entry in a pattern chaining definition.

40. The tester of claim 39, further comprising:

a last loop pattern definition pointer register for pointing to an entry in a pattern chaining definition, the entry corresponding to a beginning of a loop.

41. The tester of claim 37, wherein:

the buffer memory is a first-in first-out memory.

42. The tester of claim 37, further comprising:

a begin/end first-in first-out memory operating to identify the bit positions of pattern beginnings and endings in words of pattern data.

43. The tester of claim 37, wherein the tester has a processor-per-pin architecture and the pattern data memory, the chaining control registers, the buffer memory, and the pattern data output sequencer are all components of a local sequencer associated with a pin of the tester.

44. The tester of claim 43, wherein:

the current pattern pointer register of the chaining control registers is one of a pair of registers the contents of which define the beginning and ending of the current pattern.

45. The tester of claim 43, wherein the local sequencer further comprises:

a current definition pointer register for pointing to a current entry in a pattern chaining definition.

46. The tester of claim 43, wherein:

the buffer memory is a first-in first-out memory.

47. The tester of claim 43, wherein the local sequencer further comprises:

a begin/end first-in first-out memory operating to identify the bit positions of pattern beginnings and endings in words of pattern data.

48. The tester of claim 43, wherein the local sequencer further comprises:

a last loop pattern definition pointer register for pointing to an entry in a pattern chaining definition, the entry corresponding to a beginning of a loop.

* * * * *